United States Patent [19]
Nakamura

[11] Patent Number: 5,453,996
[45] Date of Patent: Sep. 26, 1995

[54] ERROR CORRECTION METHOD

[75] Inventor: Hiroshi Nakamura, Saitama, Japan

[73] Assignee: Pioneer Electronic Corporation, Tokyo, Japan

[21] Appl. No.: 67,126

[22] Filed: May 26, 1993

[30] Foreign Application Priority Data

May 29, 1992 [JP] Japan .................................. 4-139033

[51] Int. Cl.⁶ .................................................. G06F 11/10
[52] U.S. Cl. ...................... 371/37.5; 371/38.1; 371/39.1
[58] Field of Search ................................ 371/37.5, 37.6, 371/37.7, 38.1, 39.1, 37.4

[56] References Cited

U.S. PATENT DOCUMENTS

| 4,677,622 | 6/1987 | Okamoto | 371/37.5 |
| 4,852,099 | 7/1989 | Ozaki | 371/37.5 |
| 4,998,252 | 3/1991 | Suzuki et al. | 371/37.5 |
| 5,357,526 | 10/1994 | Jang et al. | 371/37.4 |
| 5,371,751 | 12/1994 | Moriyama | 371/39.1 |
| 5,381,422 | 1/1995 | Shimizu | 371/37.4 |

Primary Examiner—Roy N. Envall, Jr.
Assistant Examiner—Brian C. Oakes
Attorney, Agent, or Firm—Sughrue, Mion, Zinn, Macpeak & Seas

[57] ABSTRACT

An error correction method which can reduce the capacity of and the accessing frequency to a pointer RAM to allow high speed reproduction of recorded data is disclosed. The method corrects an error of cross-interleaved data to which two error correction codes of $C_1$ and $C_2$ are added, and comprises the steps of producing, for each one frame upon decoding based on the error correction codes $C_1$ and $C_2$, an error pointer indicative of an error condition of the data, and performing error correction based on a condition of the error pointer.

6 Claims, 7 Drawing Sheets

FIG. 2

TABLE OF INPUTS/OUTPUTS OF DECODER

| DECODER INPUT | Y1 | 4 × Y1 | Y2 | Y |
|---|---|---|---|---|
| 27 | 27 | 108 | 0 | 108 |
| 26 | 26 | 104 | 0 | 104 |
| 25 | 21 | 84 | 0 | 84 |
| 24 | 20 | 80 | 0 | 80 |
| 23 | 11 | 44 | 2 | 42 |
| 22 | 10 | 40 | 2 | 38 |
| 21 | 5 | 20 | 2 | 18 |
| 20 | 4 | 16 | 2 | 14 |
| 19 | 25 | 100 | 0 | 100 |
| 18 | 24 | 96 | 0 | 96 |
| 17 | 19 | 76 | 0 | 76 |
| 16 | 18 | 72 | 0 | 72 |
| 15 | 9 | 36 | 2 | 34 |
| 14 | 8 | 32 | 2 | 30 |
| 13 | 3 | 12 | 2 | 10 |
| 12 | 2 | 8 | 2 | 6 |
| 11 | 23 | 92 | 0 | 92 |
| 10 | 22 | 88 | 0 | 88 |
| 9 | 19 | 76 | 0 | 76 |
| 8 | 18 | 72 | 0 | 72 |
| 7 | 7 | 28 | 2 | 26 |
| 6 | 6 | 24 | 2 | 22 |
| 5 | 1 | 4 | 2 | 2 |
| 4 | 0 | 0 | 2 | -2 |

ERROR CORRECTION METHOD

BACKGROUND OF THE INVENTION

1. Field of the Invention

This invention relates to a method of correcting one or more errors in cross-interleaved data to which two error correction codes $C_1$ and $C_2$ are added.

2. Description of Related Art

A compact disk (CD) employs a cross-interleaved Reed Solomon code (hereafter referred to simply as CIRC) for error correction. A general construction of a CIRC decoder for a compact disk is shown in FIG. 7. Referring to FIG. 7, data of 32 symbols for one frame read out from a compact disk and EFM demodulated are supplied to a descramble circuit 21, in which odd-numbered symbols of the data are delayed by one frame interval. The output data of the descramble circuit 21 are inputted to a $C_1$ decoder 22.

The $C_1$ decoder 22 performs error correction of the data of 32 symbols of one frame with 4 symbols for P parity and outputs data of 28 symbols of one frame. The data of 28 symbols of one frame are supplied to a deinterleave circuit 23, in which deinterleaving over the maximum of 108 (27D) frames is performed. The output data of the deinterleave circuit 23 are supplied to a $C_2$ decoder 24.

The $C_2$ decoder 24 performs error correction of the data of 28 symbols of one frame with 4 symbols for Q parity and outputs data of 24 symbols of one frame. The data of 24 symbols of one frame after the error correction process are supplied to another descramble circuit 25, in which re-arrangement of order and one-frame delaying of the data are performed to restore the original order of the data. The output data of the descramble circuit 25 are supplied to a processing circuit at a next stage such as, for example, an interpolation circuit.

Upon such error correction of the CIRC as described above, error pointers each representative of presence or absence of an error are produced upon composite decoding of $C_1$ and $C_2$ codes and transmitted to the succeeding stages to be utilized for error correction or interpolation in order to assure a high degree of reliability in the error correction process.

In conventional error correction techniques as described above, an error pointer is produced for each symbol, constituting a frame. Consequently, the conventional error correction is disadvantageous in that a large number of error pointers is required; thus, requiring a corresponding large capacity of RAM (random access memory, hereinafter referred to as "pointer RAM") for storing error pointers therein. In addition, a large number of access times to the pointer RAM for writing and reading is required and much time is required for processing the pointers. The disadvantage is particularly significant with a CD-ROM (compact disk read only memory) in which high speed reproduction such as quadruple speed reproduction can be performed.

SUMMARY OF THE INVENTION

It is an object of the present invention to provide an error correction method which can reduce the capacity of and the accessing frequency to a pointer RAM to allow high speed reproduction of recorded data.

In order to attain the object described above, according to the present invention, there is provided a method of correcting one or more errors in cross-interleaved data to which two error correction codes of $C_1$ and $C_2$ are added. The method includes the steps of producing, for each one frame upon decoding based on the error correction codes $C_1$ and $C_2$, an error pointer indicative of an error condition of the data, and performing error correction based on a condition of the error pointer.

With the method, since an error pointer is produced for each frame upon decoding of the error correction codes of $C_1$ and $C_2$, the number of error pointers is reduced compared with a conventional method according to which an error pointer is produced for each symbol. Accordingly, the capacity of a pointer RAM is reduced, and also the number of errors to the pointer RAM is reduced since accessing is performed once per frame. Consequently, high speed reproduction of recorded data can be achieved.

The above and other objects, features and advantages of the present invention will become apparent from the following description and the appended claims and the accompanying drawings in which like parts or elements are denoted by like reference characters.

BRIEF DESCRIPTION OF THE DRAWINGS

FIG. 2 is a table illustrating inputs and outputs to and from a decoder of the control circuit shown in FIG. 1:

DESCRIPTION OF THE PREFERRED EMBODIMENT

Figure 3:
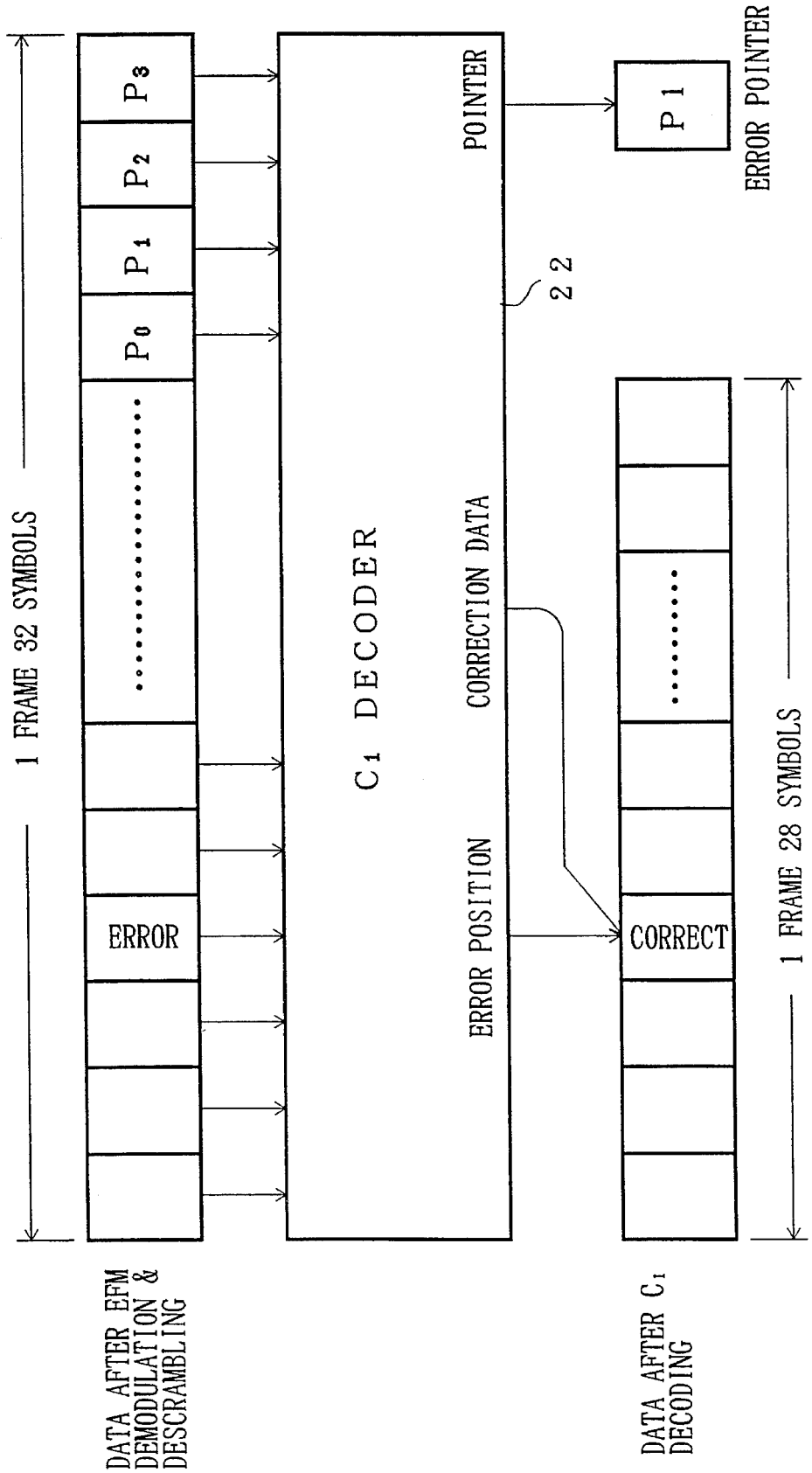
FIG. 3 is a diagram illustrating a $C_1$ decoding method to which the present invention is applied.

Referring first to FIG. 3, there is illustrated a $C_1$ decoding method to which the present invention is applied. When data of 32 symbols of one frame are inputted to a $C_1$ decoder 22, the $C_1$ decoder 22 performs error correction using 4 symbols for P parity in the input data and outputs thus obtained corrected data of 28 symbols of one frame.

Simultaneously with the error correction, the $C_1$ decoder 22 produces, for each one frame of 28 symbols decoded by $C_1$ decoding, an error pointer P1 indicative of the error condition of the frame and stores the error pointer P1 into a pointer RAM.

In the configuration shown in FIG. 3, the error pointer P1 has a one-bit construction. The error pointer P1 is set either to "0" or to "1", for example, in accordance with the criterion illustrated in FIG. 5. According to the criterion illustrated in FIG. 5, double error correction is performed based on a result of the $C_1$ decoding. It is to be noted that the error pointer P1 has the following meanings:

P1="0"→probably with no error

P1="1"→probably with an error

Figure 5:
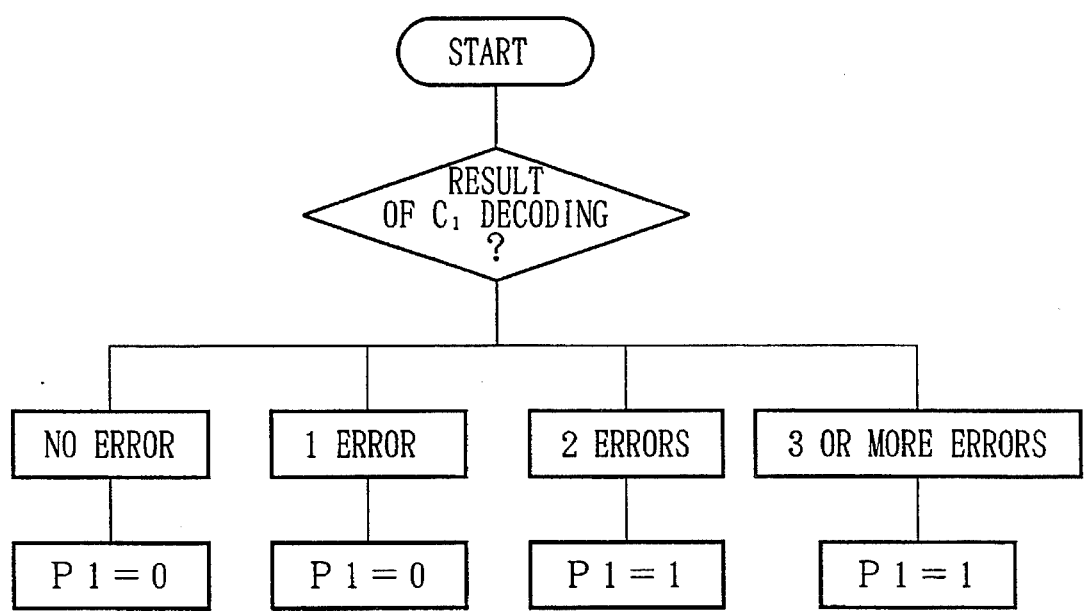
FIG. 5 is a flow chart illustrating a method of setting an error pointer in $C_1$ decoding.

A method of setting the error pointer P1 will next be described with reference to FIG. 5.

When data of 28 symbols of one frame obtained by $C_1$ decoding include no error, since no error correction is required, the error pointer P1 is set to P1="0". Further, when the data include one error, since it is considered that error correction can be performed successfully with certainty, the error pointer P1 is set to P1="0".

On the other hand, when the data of 28 symbols of one frame include two errors, while error correction up to double errors can be performed, there still remains the possibility that wrong correction may occur, and accordingly, the error pointer P1 is set to P1= "1". Further, when the data of 28 symbols of one frame include three or more errors, since the errors cannot be corrected in the $C_1$ decoder, the error pointer P1 is set to P1="1".

Figure 4:
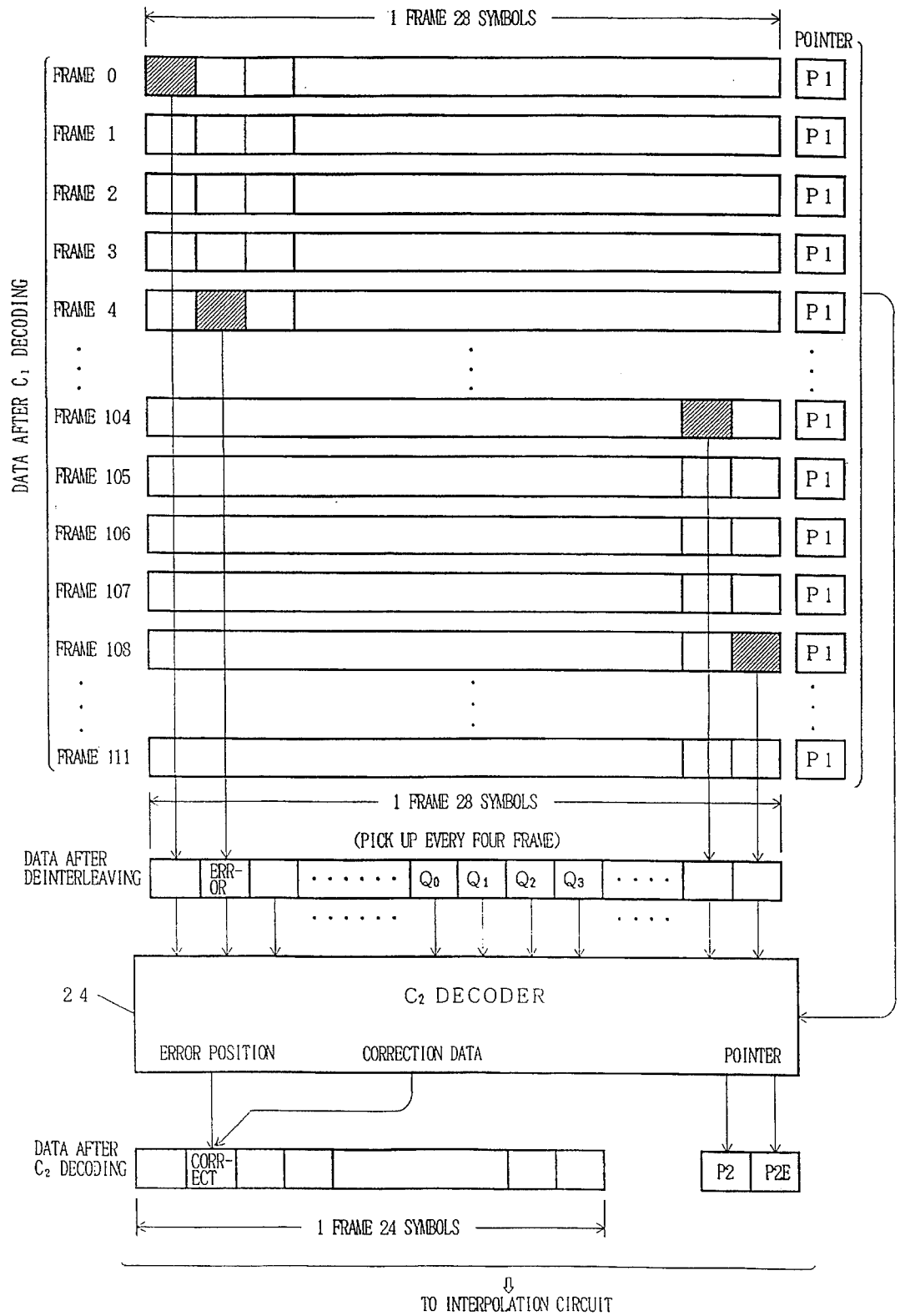
FIG. 4 is a diagram illustrating a $C_2$ decoding method to which the present invention is applied.

The error pointer P1 for each frame produced in this manner is supplied to a $C_2$ decoder 24 shown in FIG. 4. Meanwhile, the symbol data of successive frames are deinterleaved by picking up symbol data for every four frames for successive symbols as seen from FIG. 4, and the symbol data obtained by the deinterleaving are inputted to the $C_2$ decoder 24.

Referring to FIG. 4, the $C_2$ decoder 24 performs error correction of the data of 28 symbols of one frame after the deinterleaving using 4 symbols for Q parity included in the frame and the error pointers P1 of the successive frames obtained by the $C_1$ decoding described above. The $C_2$ decoder 24 outputs corrected data of 24 symbols of one frame.

Simultaneously with the error correction, the $C_2$ decoder 24 produces, for each one frame of 24 symbols obtained by the $C_2$ decoding, two error pointers P2 and P2E indicative of an error condition of the frame, and stores the error pointers P2 and P2E into the pointer RAM (not shown).

Figure 6:
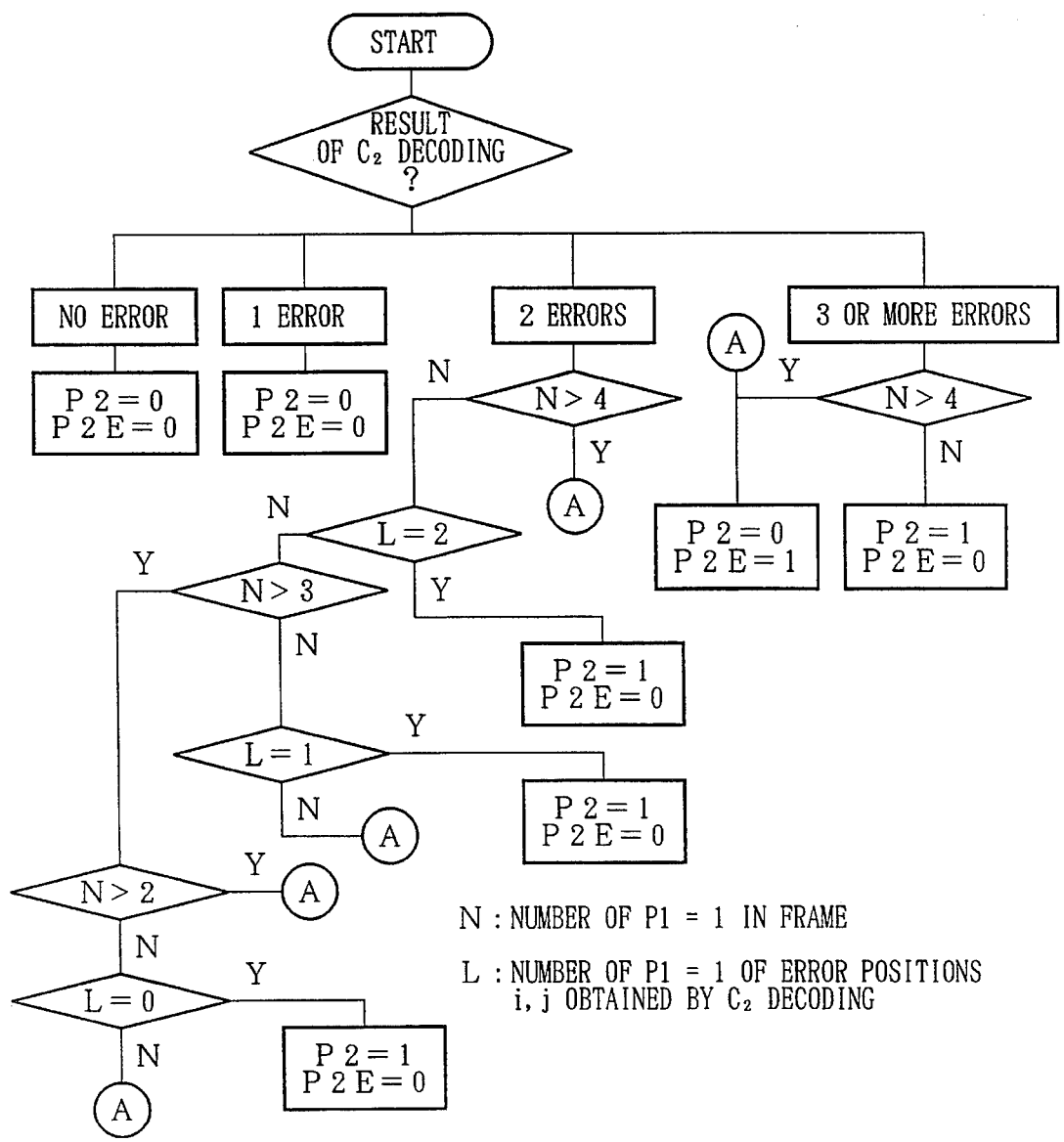
FIG. 6 is a flow chart illustrating a method of setting an error pointer in $C_2$ decoding.

Each of the pointers P2 and P2E has a one-bit construction and is set either to "0" or "1", for example, in accordance with the criterion illustrated in FIG. 6. According to the criterion illustrated in FIG. 6, double error correction is performed by $C_2$ decoding. It is to be noted that the error pointers P2 and P2E have the following meanings:
P2="0"→probably with no error
P2="1"→probably with an error
P2E="0"→$C_2$ decoding is so high in reliability as to allow interpolation with P2
P2E="1"→$C_2$ decoding is so low in reliability as to require, in place of P2, copying of P1 of each symbol and interpolation with P1

A method of setting the error pointers P2 and P2E will be described subsequently with reference to FIG. 6.

When data of 24 symbols of one frame obtained by $C_2$ decoding include no error, since no error correction is required, the error pointers P2 and P2E are set to P2= "0" and P2E="0". Further, when the data include one error, since it is considered that error correction can be performed successfully with certainty, the error pointers P2 and P2E are set to P2="0" and P2E= "0".

On the other hand, when the data of 24 symbols of one frame include two errors or three or more errors, the error pointers P2 and P2E are set to such values as given below in accordance with the condition of errors. It is to be noted that, in the following description, characters N and L represent N: number of error pointers P1="1" in a C2 decoding frame (0≦N≦28)
L: number of error pointers P1="1", and two error symbol positions i and j within a C2 decoding frame obtained by the $C_2$ decoding (0≦L≦2)

When the number of errors in the data of 24 symbols of one frame is 2,
if N>4, then P2="0", P2E="1"
if N≧4 and L=2, then P2="1", P2E="0"
if N≧3 and L=1, then P2="1", P2E="0"
if N≧2 and L=0, then P2="1", P2E="0"
in any other case, P2="0", P2E="1"

When the number of errors in the data of 24 symbols of one frame is 3 or more.
if N≦3, then P2="1", P2E="0"
if N>4, then P2="0", P2E="1"

After the error correction by the $C_2$ decoding is completed in such a manner as described above, the data of 24 symbols of one frame are supplied to an interpolation circuit at a next stage, in which interpolation processing is performed. In this instance, the error pointers P1, P2 and P2E produced as described above and having a total of 3 bits are simultaneously supplied to the interpolation circuit so that the interpolation circuit may determine based on the conditions of the error pointers P1, P2 and P2E whether or not data interpolation should be performed. For example.
P2="0", P2E="0"→no interpolation is required
P2="1", P2E="0"→interpolation is performed for all data included in the frame
P2="0", P2E="1"→24 error pointers P1 of the frame are copied in place of the error pointers P2, and interpolation is performed for symbol data for which P1="1"

Figure 1:
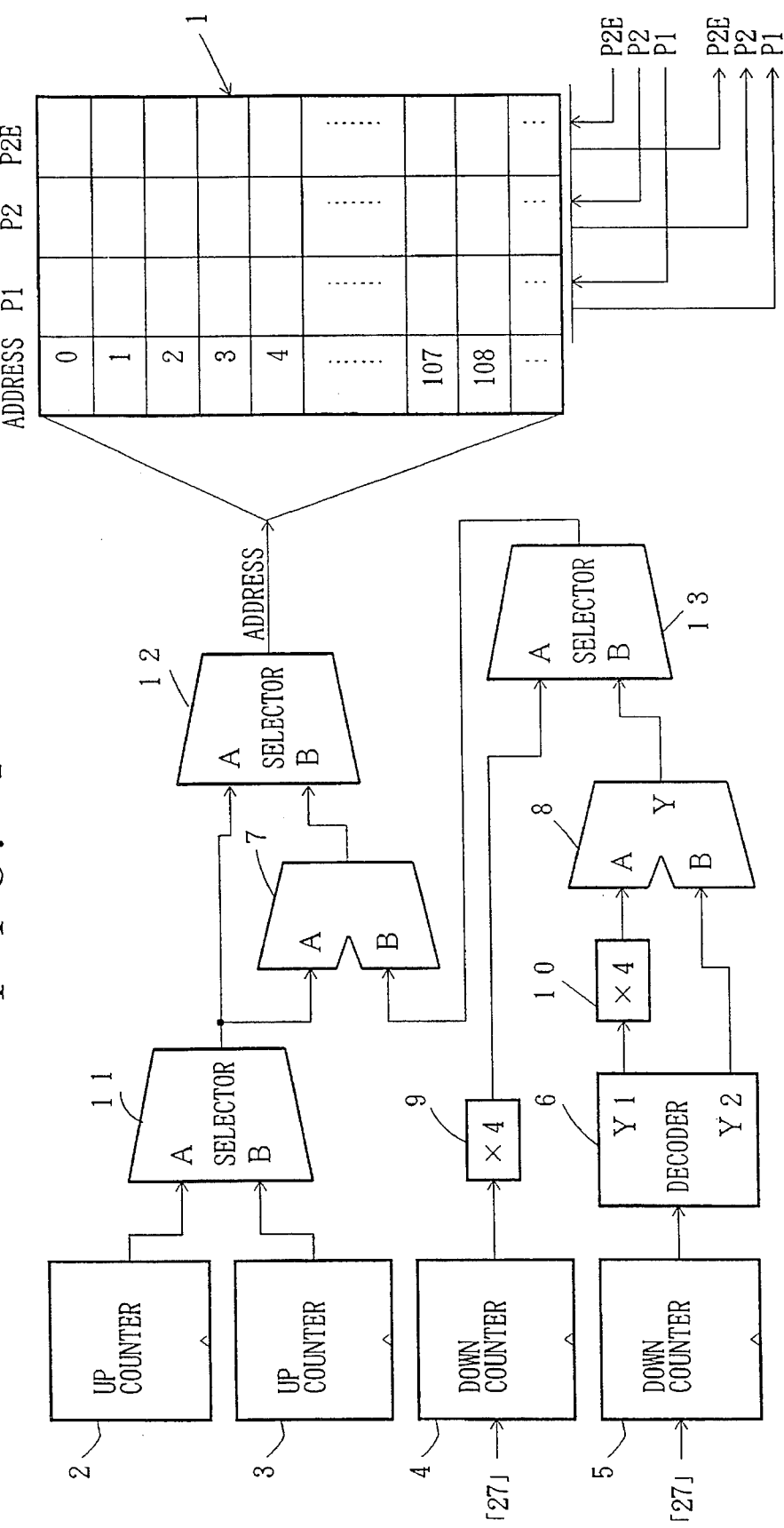
FIG. 1 is a block diagram of a pointer RAM and a control circuit for the pointer RAM to which the present invention is applied.

FIG. 1 shows an example of configuration of the pointer RAM for storing therein the error pointers P1, P2 and P2E described above and an address control circuit for the pointer RAM. Referring to FIG. 1, the circuit configuration shown includes a pointer RAM having a memory capacity of (109+α)×3 bits (α is a value for absorption of jitters), a pair of up counters 2 and 3, a pair of down counters 4 and 5, a decoder 6, a pair of subtractors 7 and 8 each for performing a subtraction of A−B, a pair of quadruple multipliers 9 and 10, and three selectors 11, 12 and 13.

First, an operation of writing the error pointer P1 obtained by the $C_1$ decoding into the pointer RAM 1 will be described. In this instance, the selectors 11 and 12 are both set to the A side. It is to be noted that the up counter 2 is successively incremented by one in synchronism with each frame.

As the up counter 2 is successively incremented by one in synchronism with a frame from its initial value 0, the count value of it is sent as an address signal to the pointer RAM 1 by way of the selectors 11 and 12. The pointer RAM 1 successively stores the values of the pointer P1 in accordance with the address signal beginning with the address 0. Accordingly, when the up counter 2 completes its counting from 0 to 107, a total of 108 values of the error pointer P1 obtained by the $C_1$ decoding are stored in the addresses 0 to 107 of the pointer RAM 1.

Subsequently, a reading out operation of the error pointer P1 upon $C_2$ decoding will be described. In this instance, the selector 11 is set to the A side: the selector 12 is set to the B side: and the selector 13 is set to the A side. It is to be noted that the down counter 4 is preset to "27" as an initial value thereof and is successively decremented by one in synchronism with each symbol of a frame.

When the initial value of 27 is outputted from the down counter 4, the value is multiplied by 4 by the quadruple multiplier 10. and the resultant output value of 108 of the quadruple multiplier 10 is inputted to the A terminal of the subtractor 7 by way of the selector 13. Meanwhile, since $C_2$ decoding is enabled after the $C_1$ decoding has been performed for 109 frames, the output value 108 is outputted from the up counter 2 and inputted to the B terminal of the subtractor 7 by way of the selector 11.

The subtractor 7 performs subtraction A−B of the values inputted to the A and B terminals thereof, that is, A−B= 108−108=0, and sends the resultant difference value of 0 as an address signal to the pointer RAM 1 by way of the selector 12. Upon reception of the address signal, the pointer RAM 1 reads out the error pointer P1 at the address 0 position thereof and sends it to the $C_2$ decoder.

Subsequently, the down counter 4 is decremented by one and outputs its count value of 26. The value 26 is multiplied by 4 into 104 by the quadruple multiplier 9, and the resultant value 104 is inputted to the subtractor 7. Meanwhile, the count value of 108 continues to be outputted from the up counter 2 of one frame. Accordingly, the difference or subtraction value A−B of the subtractor 7 is 108−104=4. Consequently, the error pointer P1 stored at the position of the address 4 of the pointer RAM 1 is read out and sent to the $C_2$ decoder.

When the reading out processing of the error pointer P1 is successively performed from the count value 27 to the count value 0 of the down counter 4, a total of 28 values of the error pointer P1 at the positions of the addresses 0, 4, 8, 12, . . . , 104 and 108 are read out from the error pointer RAM 1. The 28 error pointers P1 read out in this manner are error pointers P1 of frames corresponding to the symbols of the data of 28 symbols of one frame after deinterleaving (refer to FIG. 4). The thus read out 28 error pointers P1 are sent to the $C_2$ decoder 24 so as to be used for $C_2$ decoding.

After reading out of the first 28 error pointers P1 is completed in such a manner as described above, the up counter 2 is incremented by one to the new count value 1. Then, the down counter 4 is preset again to the initial value 27, and the reading out operation for the error pointer P1 is repeated. Accordingly, each time the processing advances one frame distance, the positions of the 28 error pointers P1 read out from the pointer RAM 1 are shifted downwardly by one address distance as a whole.

Subsequently, an operation of writing the error pointers P2 and P2E produced by $C_2$ decoding into the pointer RAM 1 will be described. Writing of the error pointers P2 and P2E into the pointer RAM 1 is performed in accordance with the same method as in the reading out operation for the first one word of the error pointer P1 for $C_2$ decoding described above.

In particular, the down counter 4 is preset to the initial value 27, and the error pointers P2 and P2E are written into areas for the error pointers P2 and P2E, respectively, of an address of the pointer RAM 1 calculated by the subtractor 7. In this instance, the value of the error pointer P1 at the address is not varied.

Subsequently, an operation of reading out the error pointers P1, P2 and P2E obtained by the $C_1$ and $C_2$ decoding from the pointer RAM 1 in order to send the error pointers P1, P2 and P2E to the interpolation circuit will be described. In this instance, the selectors 11, 12 and 13 are individually set to the B side. The down counter 5 is preset to the initial value 27 and is decremented by one in synchronism with each symbol of a frame. Meanwhile, the up counter 3 is successively incremented by one from the count value 0 in synchronism with a frame.

The down counter 5 is successively decremented by one from the initial value 27, and sends its count value to the decoder 6. The decoder 6 decodes the count value into outputs Y1 and Y2 illustrated in FIG. 2 in accordance with a predetermined processing procedure and outputs the resultant output values Y1 and Y2.

The output Y1 of the decoder 6 is multiplied by 4 by the quadruple multiplier 10 and then inputted to the A terminal of the subtractor 8. Meanwhile, the output Y2 of the decoder 6 is inputted to the B terminal of the subtractor 8. The subtractor 8 thus performs the subtraction A−B and outputs the resultant difference value Y as seen from FIG. 2. The difference value Y is inputted to the A terminal of the subtractor 7 by way of the selector 13.

Figure 7:
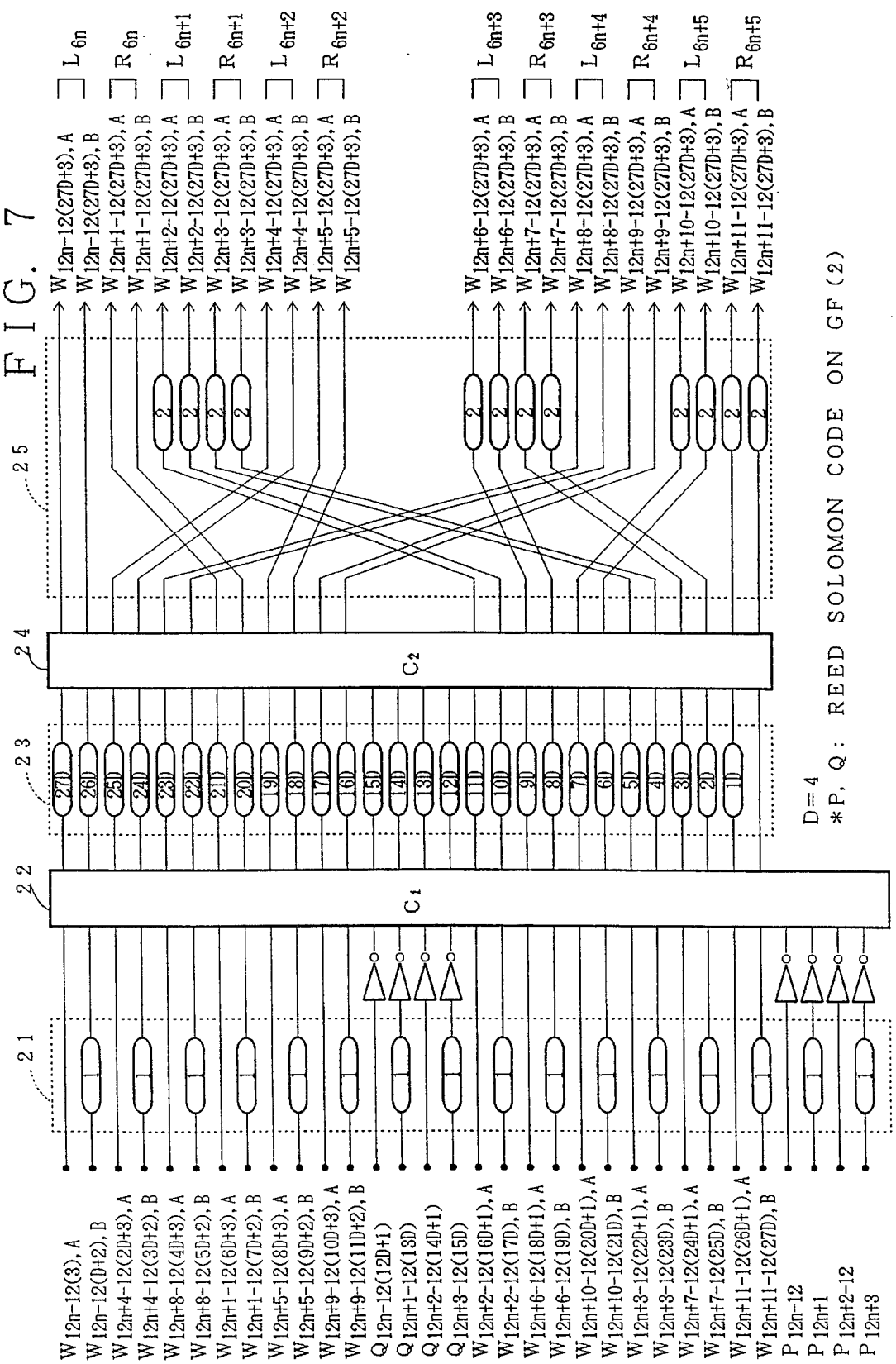
FIG. 7 is a block diagram showing a general construction of a CIRC decoder.

It is to be noted that the operations of the decoder 6, the quadruple multiplier 10 and the subtractor 8 are performed in order to realize the same processing as that of the deinterleave circuit 23 and the descramble circuit 25 of the CIRC decoder of FIG. 7.

The subtractor 7 performs subtraction between the difference value Y inputted to the A terminal thereof and the initial value 0 from the up counter 3 inputted to the B terminal thereof, and sends the resultant difference value as an address signal to the pointer RAM 1 by way of the selector 12.

Accordingly, in the case of the first frame, the subtraction output of the subtractor 7 is 108−Y, and the error pointers P1, P2 and P2E are outputted from the pointer RAM 1 that are coincident with data of 24 symbols of one frame after descrambling outputted from the descramble circuit 25 of FIG. 7 and are sent to the interpolation circuit.

The interpolation circuit decodes the error pointers P1. P2 and P3 read out in such a manner as described above in accordance with the following equation to determine a final error pointer P for determination whether or not interpolation for the frame is required. Then, in accordance with the error pointer P thus obtained, the interpolation circuit performs interpolation of the entire frame OF interpolation of the corresponding data.

$$P=P2_{(27)}+P2E_{(27)} \cdot P1_{(i)}$$

where $P2_{(27)}$ and $P2E_{(27)}$ are values of the error pointers P2 and P2E, respectively, when the count value of the down counter 5 is 27, and $P1_{(i)}$ is a value of the error pointer P1 when the count value of the down counter 5 is i (i=27 to 0).

For example, when $P2_{(27)}$="0" and $P2E_{(27)}$= "0", since $P=P2_{27}+P2E_{(27)} \cdot P1_{(i)}=0+0 \cdot P1_{(i)} = 0$, no interpolation is required. On the other hand, when $P2_{(27)}$="1" and P2E="0", since $P=P2_{(27)}+ P2E_{(27)} \cdot P1_{(i)=P2(27)}+0 \cdot P1_{(i)}=P2_{(27)}=1$, interpolation is performed for the data. On the other hand, when $P2_{(27)}$="0" and P2E="1", since $P=P2_{(27)} +P2E_{(27)} \cdot P1_{(i)}=0+ 1 \cdot P1_{(i)}=P1_{(i)}$, interpolation is performed for the symbol data for which the error pointer P1 is P1="1". In this manner, interpolation processing is performed in accordance with a predetermined rule.

After reading out the error pointers P1, P2 and P2E of one frame is completed in this manner, the up counter 3 is incremented by one into a new count value 1. Then, the down counter 4 is preset to the initial value 27 again, and a reading out operation same as that described above is repeated to perform interpolation processing.

It is to be noted that, in the case of a compact disk player, reading out of recorded data from a disk and outputting of reproduction data are performed asynchronously. Normally, reproduction data are outputted accurately in synchronism with a crystal oscillator while reading out of recorded data from a disk is performed at timings that include jitters. Accordingly, in order to cope with this, the up counter 2 of FIG. 1 is synchronized with reading out timings of recorded data from a disk while the up counter 3 is synchronized with a crystal oscillator.

To this end, the up counters 2 and 3 are controlled so that, even if some temporal fluctuation (jitter) occurs with the rate at which the up counter 2 counts up, the count value of the up counter 2 may be different by some amount from the count value of the up counter 3 so that the up counter 2 may not pass the up counter 3. Accordingly, also the pointer RAM 1 is required to have some margin in the capacity thereof correspondingly. The value α mentioned hereinabove in that the capacity of the RAM 1 is (109+α)×3 bits represents such margin, and usually, α=8 to 58 or so is adopted.

While the case wherein a RAM for exclusive use is used as the pointer RAM is described in the embodiment described above, when a data RAM has a sufficiently large capacity or in a like case, a memory area for error pointers may be ensured on the data RAM so as to perform the processing described hereinabove using the area.

Having now fully described the invention, it will be apparent to one of ordinary skill in the art that many changes and modifications can be made thereto without departing from the spirit and scope of the invention as set forth herein.

What is claimed is:

1. A method of correcting an error of cross interleaved data to which two error correction codes of $C_1$ and $C_2$ are added, comprising the steps of:

converting a stream of cross interleaved data into a series of symbols divided into a first and second plurality of frames;

producing, for each frame in said first plurality of frames upon $C_1$ decoding, a single error pointer P1 based on the number of symbol errors occurring in each of said frames in said first plurality of frames;

producing, for each frame in said second plurality of frames upon $C_2$ decoding, a single error pointer P2 based on the number of errors occurring in $C_2$ decoding and a first value N indicative of the number of data symbols in the second plurality of frames whose corresponding first frame had at least a predetermined number of symbol errors as indicated by the single error pointer P1;

producing, for each frame in said second plurality of frames upon $C_2$ decoding, a single error pointer P2E based on the number of errors occurring in $C_2$ decoding and a second value L indicative of the number of data symbols at a first and second position (i, j) in the second plurality of frames whose corresponding first frame had at least a predetermined number of symbol errors as indicated by the single error pointer P1;

producing a single error pointer P based on the states of P1, P2 and P2E that determines whether the data frames corresponding to the error pointers will be subject to additional error correction; and performing error correction based on the error pointer P.

2. The error correction method of claim 1 further comprising the steps of:

storing values of the single error pointers P1 of each frame in the first plurality of frames into random access memory upon $C_1$ decoding via an up counter which is successively incremented in synchronism with the $C_1$ decoding of each frame where an output of said up counter corresponds to an address signal in the random access memory;

reading the values of the single error pointers P1 of each frame in the first plurality of frames from the random access memory for use in $C_2$ decoding via a down counter, said up counter, multiplier, and subtractor;

storing values of the single error pointers P2 and P2E of each frame in the second plurality of frames to the random access memory after $C_2$ decoding via said down counter, up counter, multiplier, and subtractor; and reading the error pointers P1, P2, and P2E from the random access memory via said down counter, decoder, multiplier, and subtractor in order to simulate the deinterleaving and descrambling which the data is subjected to, for use by additional error correction circuits.

3. The error correction method of claim 2, wherein the decoder produces predesignated values $Y_1$ and $Y_2$ depending on an input from a counter.

4. The error correction method of claim 1, further comprising the step of producing the pointer P based on the formula:

$$P=P2+P2E * P1_{(i)}$$

where

P2=P2 when input counter has value X.

P2E=P2E when input counter has value X.

$P1_{(i)}$=P1 when input counter has value i for i=27 to 0.

5. The error correction method of claim 1 wherein the error pointers P1, P2, and P2E each comprises a single bit.

6. An error correction unit for correcting an error of cross interleaved data to which two error correction codes of $C_1$ and $C_2$ are added, said unit comprising:

means for converting a stream of cross interleaved data into a series of symbols divided into a first and second plurality of frames;

a $C_1$ decoder, coupled to said converting means, for producing, for each frame in said first plurality of frames upon $C_1$ decoding, a single error pointer P1 based on the number of symbol errors occurring in each of said frames in said first plurality of frames;

a memory coupled with said $C_1$ decoder, said memory storing said P1 pointers after $C_1$ decoding and reading said pointers for use in $C_2$ decoding;

a $C_2$ decoder, coupled with said memory, comprising first means for producing, for each frame in said second plurality of frames upon $C_2$ decoding, a single error pointer P2 based on the number of errors occurring in said $C_2$ decoding and a first value N indicative of the number of data symbols in the second plurality of frames whose corresponding first frame had at least a first predetermined number of symbol errors as indicated by the single error pointer P1, and second means for producing, for each frame in said second plurality of frames upon said $C_2$ decoding, a single error pointer P2E based on the number of errors occurring in said $C_2$ decoding and a second value L indicative of the number of data symbols at a first and second position in the second plurality of frames whose corresponding first frame had at least a second predetermined number of symbol errors as indicated by the single error pointer P1, wherein said memory stores said error pointers P1, P2, and P2E and outputs said error pointers to additional error correction circuit;

means for producing a single error pointer P based on the states of P1, P2 and P2E that determines whether the data frames corresponding to the error pointers will be subject to additional error correction; and means for performing error correction based on the error pointer P.

* * * * *